United States Patent
Huang et al.

(10) Patent No.: US 7,680,615 B2
(45) Date of Patent: Mar. 16, 2010

(54) PARALLEL TESTING SYSTEM WITH SHARED GOLDEN CALIBRATION TABLE AND METHOD THEREOF

(75) Inventors: Chung-Er Huang, Taipei (TW); Chih-Hao Liao, Taipei (TW)

(73) Assignee: Azurewave Technologies, Inc., Taipei (TW)

( * ) Notice: Subject to any disclaimer, the term of this patent is extended or adjusted under 35 U.S.C. 154(b) by 0 days.

(21) Appl. No.: 12/010,454

(22) Filed: Jan. 25, 2008

(65) Prior Publication Data
US 2009/0192750 A1 Jul. 30, 2009

(51) Int. Cl.
G01D 18/00 (2006.01)
G06F 7/38 (2006.01)

(52) U.S. Cl. .................................. 702/85; 712/240

(58) Field of Classification Search .................. 702/85, 702/107, 108, 182, 188, 189, 81, 84, 90, 702/117–119, 121, 183; 324/537, 763–765, 324/73.1, 555, 759; 700/9, 19, 20, 28, 73, 700/75, 76, 95–97, 108, 109; 257/48; 712/1, 712/11, 16, 32, 206, 239, 240; 714/724, 714/734, 738, 746, 768
See application file for complete search history.

(56) References Cited

U.S. PATENT DOCUMENTS

| | | | | |
|---|---|---|---|---|
| 6,476,628 B1 * | 11/2002 | LeColst | ........................ | 324/765 |
| 7,106,081 B2 * | 9/2006 | Mayder et al. | .............. | 324/758 |
| 7,496,467 B2 * | 2/2009 | Fritzsche | ..................... | 702/122 |
| 2002/0158625 A1 * | 10/2002 | Mayr et al. | .............. | 324/158.1 |
| 2005/0261855 A1 * | 11/2005 | Adachi et al. | ................ | 702/108 |
| 2006/0130041 A1 * | 6/2006 | Pramanick et al. | .......... | 717/168 |

OTHER PUBLICATIONS

Adachi et al., Parallel, Multi-DUT testing in an Open Architecture Test System, 2005 IEEE, pp. 1-9.*
Xiao-ping et al., The TPS Development of Parallel Automatic Test Systems, 2004 IEEE, pp. 248-253.*

* cited by examiner

Primary Examiner—Michael P. Nghiem
Assistant Examiner—Toan M Le
(74) Attorney, Agent, or Firm—Rosenberg, Klein & Lee

(57) ABSTRACT

A parallel testing system with shared golden calibration table includes: a storage unit, multiple testing platforms, and a server. The storage unit is used for storing the golden calibration table, and the testing platforms are used to test a device under test (DUT) respectively by utilizing the golden calibration table. The server is connected to the storage unit and the testing platforms to send the golden calibration table to the testing platforms, and then, to cumulatively record calibration data produced after the testing platforms respectively test the DUTs, so that the server can further perform a weighted arithmetic operation to the calibration data so as to update the golden calibration table. Thereby, the purpose of accelerating the convergence speed of the golden calibration table can be achieved.

10 Claims, 2 Drawing Sheets

PARALLEL TESTING SYSTEM WITH SHARED GOLDEN CALIBRATION TABLE AND METHOD THEREOF

BACKGROUND OF THE INVENTION

1. Field of the Invention

The present invention is related to a parallel testing system and a method thereof, and more particularly to a parallel testing system with shared golden calibration table and a method thereof.

2. Description of Related Art

Owing to the development of technology, modern electronic products become better and better and the production yield continue to increase. Product testing before factory shipping is therefore extremely important since this step decides the quality of the product and also the speed of production procedure for the whole production line.

Take a calibration table from a high frequency communication module as example. Since the information contained in a calibration table often relates to calibration parameters that include path loss, amplifier gain, and clock signal, which has to be stored in the high frequency communication module for operation, the calibration table has to be burned into the memory of the high frequency communication module before it leaves the factory, so that the module can operate correctly.

All the calibration parameters in the calibration table have to pass through several complicated calibration procedures which consumes a lot of time. Conventionally, in a testing line, the calibration table of a previous device under test (DUT) is used as the forecasted calibration table of the next DUT, and if the forecasted calibration table can pass the testing condition, then the forecasted calibration table is written into the memory of the DUT. But, if the forecasted calibration cannot pass the testing condition, the calibration procedure has to be re-started. After having sufficient number of DUT tested and multiple calibration procedures executed, the calibration table will converge to a stable value. Since in conventional method each module has to pass through this testing procedure separately, it is difficult to conform to client's demand for the yield of high frequency communication module, and the only solution is to increase the testing line.

However, even though increasing the number of testing line might fix this problem, the time for calibrating each of the calibration table is still fixed and will not be reduced since the testing line operates and produces the calibration table convergence individually. Thus, not only does the process still consume a lot of time to converge the calibration table, but the cost also has to be increased to improve the performance.

Therefore, how to effectively reduce the time for converging calibration table so as to improve the performance without increasing cost is really an important subject.

SUMMARY OF THE INVENTION

Consequently, for solving the problem described above, the present invention provides a server to integrate all testing lines, so that the calibration data can be produced simultaneously, and since the calculation is executed according to the number of device under test (DUT), the accumulation of the data cause the convergence of calibration table to become faster and a golden calibration table can be obtained more quickly. Thereafter, the golden calibration table can be provided to each testing line for testing later DUTs. Accordingly, the purpose of quickly obtaining calibrated and converged golden calibration table is achieved and performance improved.

To achieve the DUT described above, the present invention provides a parallel testing system with shared golden calibration table including a storage unit, multiple testing platforms and a server. The storage unit is used for storing golden calibration table, several multiple testing platforms are used for testing a device under test (DUT) by utilizing the golden calibration table, and the server is connected to the storage unit and the testing platforms to provide the golden calibration table to each of the testing platforms, the server cumulatively records the calibration data produced after the testing platforms test each DUT, and executing a weighted arithmetic operation to the calibration data for updating the golden calibration table.

To achieve the DUT described above, the present invention also provides a parallel testing method with shared golden calibration table including steps of: providing a DUT to several multiple testing platforms, the platforms then obtains a golden calibration table. Each of these multiple testing platforms then test the DUT by using the golden calibration table and respectively produce a calibration data, and the server cumulatively record the calibration data and execute a weighted arithmetic operation for updating the golden calibration table, thereby accelerating the calibration convergence of the golden calibration table.

BRIEF DESCRIPTION OF THE DRAWINGS

The foregoing aspects and many of the apparent advantages of this application will be more readily appreciated as the same becomes better understood by reference to the following detailed description, when taken in conjunction with the accompanying drawings, wherein.

DETAILED DESCRIPTION OF PREFERRED EMBODIMENTS

Through utilizing a server, the parallel testing system of the present invention integrates multiple testing lines for accumulating the calibration data so as to increase the convergence speed of golden calibration table. Furthermore, as the number of testing lines increases, the golden calibration table convergence speed becomes faster and better. Therefore, the testing time can be significantly reduced.

Figure 1:
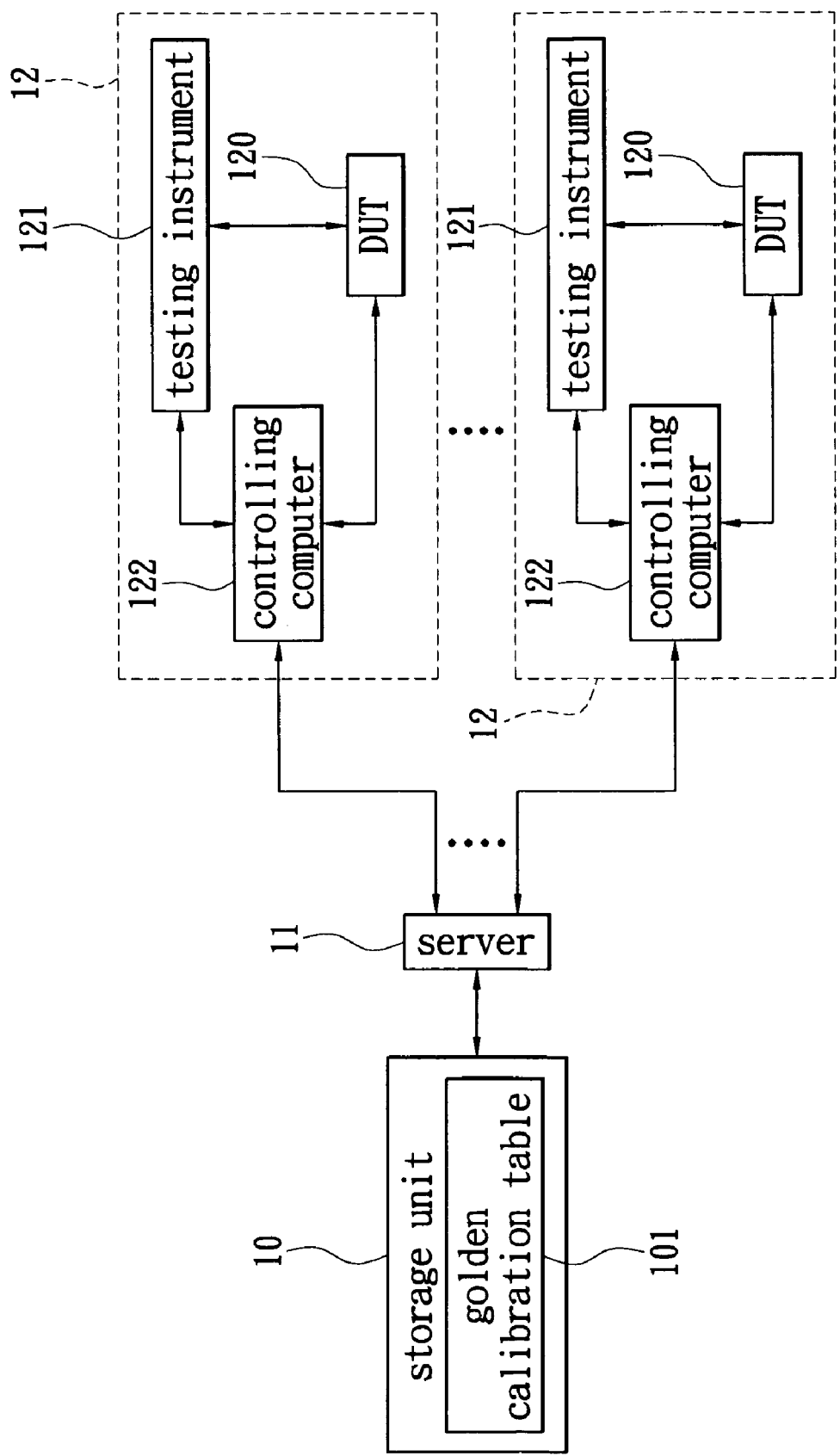
FIG. 1 is a block diagram showing a parallel testing system with shared golden calibration table according to the present invention.

Please refer to FIG. 1, which shows a parallel testing system with shared golden calibration table. As shown, the embodiment provides a parallel testing system, which shares golden calibration table 101, including a storage unit 10, a server 11 and a multiple testing platforms 12. The storage unit 10 is connected to server 11 for storing golden calibration table 101. Here, storage unit 10 can be built in server 11 or it can be externally connected to server 11. If storage unit 10 is externally connected to server 11, it can be connected via a wired or wireless manner, therefore storage unit 10 would not necessarily be restricted by the environment, and also, the testing system thus have a better flexibility.

Each testing platform 12 represents one testing line, so that the parallel testing system can simultaneously test DUTs 120 on multiple testing platforms 12, which means all tests are executed in parallel. Furthermore, since testing platform 12 belongs to the testing line, DUT 120 is not intended to mean as simply one particular DUT but should be thought of as a sequence of DUTs arriving one by one.

The server 11 is connected with each of the testing platforms 12 to provide golden calibration table 101 accessed from storage unit 10, so that testing platforms 12 can test DUT 120 according to golden calibration table 101. In other words, when each platform 12 tests the DUT 120 of its own, it will obtain the current golden calibration table 101 through the server 11 first and then test DUT 120.

Moreover, after each testing platform 12 finishes the testing of each DUT 120, a calibration data will be produced and transmitted back to server 11, and after server 11 receives the calibration data the calibration data will be recorded and accumulated, so that a weighted arithmetic operation of the calibration data can be executed to update the golden calibration table 101 that was used. That is to say, every time the testing platform 12 transmits back the calibration data, the server 11 will execute the weighted arithmetic operation once to update the golden calibration table 101, so that the testing platform 12 can obtain the updated golden calibration table 101 when executing the testing of the next DUT 120.

Furthermore, each testing platform 12 includes a testing instrument 121 and a controlling computer 122, wherein testing instrument 121 is used to generate testing signal for testing DUT 120, and the controlling computer 122 is used to control testing instrument 121 to test DUT 120 and transmit the calibration data back to the server 11 depending on the testing result. Accordingly, the controlling computer 122 will judge the testing result and burn golden calibration table 101, if the data passes the testing, into the DUT 120 so as to complete the test of each DUT 120.

Through the parallel testing system, calibration data of different testing platforms 12 can be cumulatively recorded together to simultaneously update the shared golden calibration table 101. Therefore, opposite to the conventional method that each testing platform individually finishes the convergence of golden calibration table of its own, the present invention can significantly accelerate the convergence speed of the golden calibration table 101 and reduce product testing time. For example, if a golden calibration table 101 needs to execute 1000 times of calibration convergences (expend 1000 calibration times) to achieve the stable state, through the design of the present invention, the time for achieving convergence can be reduced to 500 times if there are two testing platforms 12 for testing (so that the calibration will lower to by half). That is, as the number of testing platforms 12 increase, the convergence time saved will increase accordingly.

Figure 2:
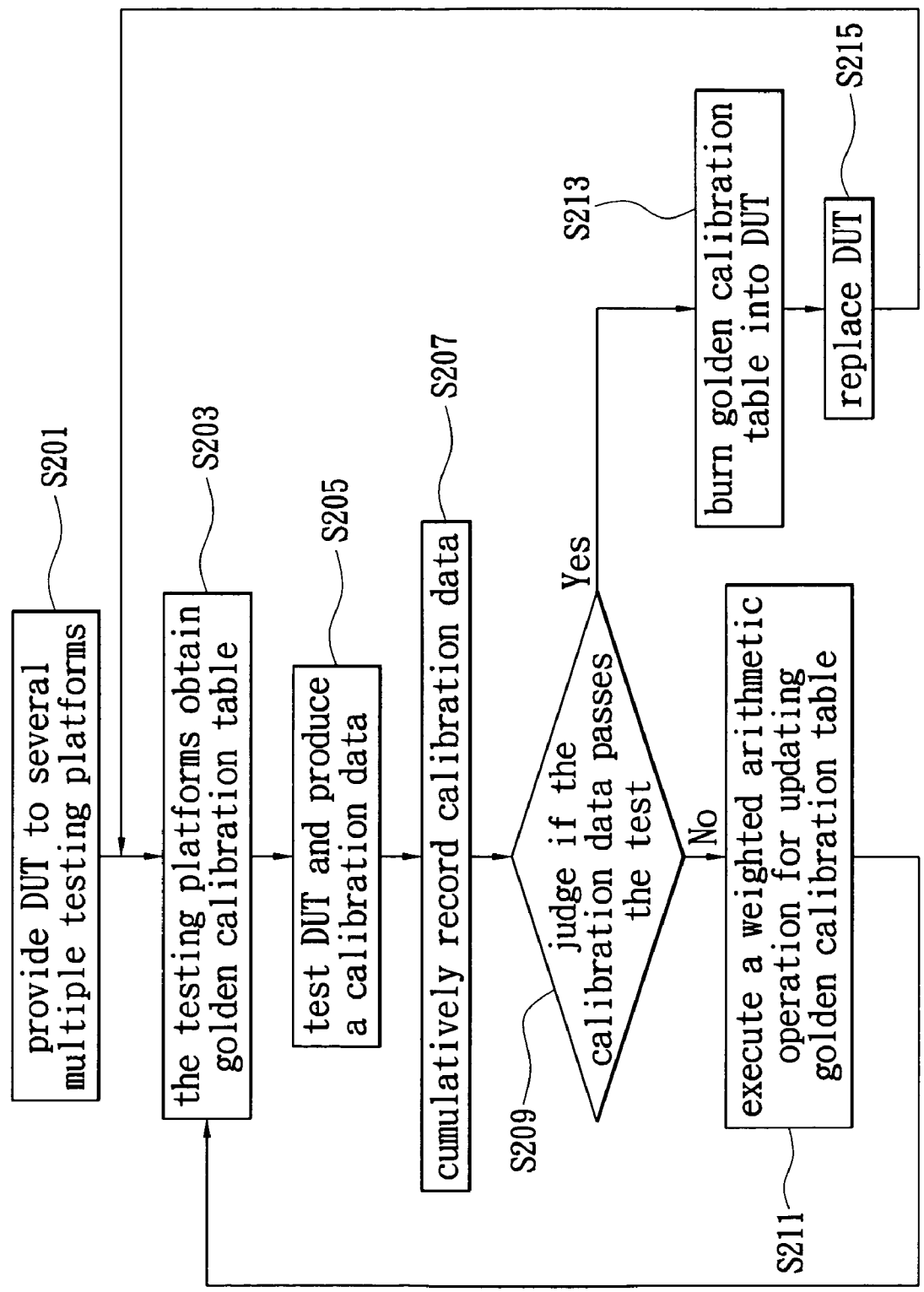
FIG. 2 is a flow chart showing a parallel testing method with shared golden calibration table according to the present invention.

Please refer to FIG. 2, which is a flow chart showing the parallel testing method with shared golden calibration table according to the present invention. As shown, the present invention provides a parallel testing method with shared golden calibration table 101. It should be known that since this is a parallel testing method, each testing platform 12 may individually and simultaneously perform the following steps.

The parallel testing method of the present invention is as followed. First, a DUT 120 is provided to a testing platform 12 (S201). Then, the testing platform 12 obtains the golden calibration table 101 (S203), and the testing platform 12 tests the DUT 120 according to the golden calibration table 101 so as to produce the calibration data (S205). Then, the produced calibration data is cumulatively recorded (S207) and also judged if it passes the test (S209) so as to realize if the golden calibration table 101 has converged to a stable value.

If the judging result in step S209 is negative, which means the current DUT 120 adjusted with the obtained golden calibration table 101 cannot pass the test, then the golden calibration table 101 is still not stable, so that the golden calibration table 101 has to be re-calibrated. Therefore, a weighted arithmetic operation is executed for updating the golden calibration table 101 (S211) in server 11. Here, the weighted arithmetic operation is performed respectively by multiplying the calibration data from all testing platforms 12 using their own DUTs 120 value, then adding the multiplied results, and dividing the sum by the sum of the DUTs 120, thereby generating the updated golden calibration table 101.

For example, if there are two testing platforms in the parallel testing system, the first and the second testing platforms, wherein the first testing platform has tested 500 DUTs and transmitted back calibration data X and wherein the second testing platform has tested 100 DUTs and transmitted back calibration data Y, then the weight arithmetic will be (500*X+100*Y)/600.

After updating the golden calibration table 101 in step S211, the testing platform 12 goes back to step S203 and re-tests the original DUT 120 to obtain an updated golden calibration table 101.

However, if the test result in step S209 is positive, it means that the current DUT 120 adjusted with the obtained golden calibration table 101 can pass the test, the golden calibration table 101 is then directly burned into the DUT 120 (S213), thus completes the testing of the current DUT 120. After step S213, the current DUT 120 with the burn-in golden calibration table 101 is replaced by next non-tested DUT 120 (S215).

In addition, the parallel testing system with shared golden calibration table and the method thereof can be applied to all kinds of fields that is dependant on the calibration parameters in the calibration table for operation (for example, wireless communication, image sensing and sound recognition). Therefore, DUT 120 can be wireless communication module, image sensing module, or sound recognizing module.

In the aforesaid, the present invention utilizes a server to integrate the calibration data generated from all testing lines, and the calibration is calculated in accordance with the number of the DUTs, so that the data for the golden calibration table can be accumulated faster which results in the speeding up of the calibration table convergence. Other than accelerating the convergence speed, the present invention also includes the advantages of:

1. Reducing testing time: By uniformly distributing the calibration time of the golden calibration table to each testing line, the calibration speed becomes faster as the number of testing lines increases, and as the testing speed improves the testing time for overall system is reduced.

2. Reducing error: Since one standardized yet continuously adjusted golden calibration table is used by all testing lines, the times for re-calibration grows as one testing line becomes abnormal, so that the problem can be found and solved earlier to reduce error.

3. Facilitating manufacture monitor: Since the convergence speed of golden calibration table is sped up, the variation of manufacturing process also can be found earlier from the golden calibration table, so as to solve the problem.

It is to be understood, however, that even though numerous characteristics and advantages of the present application have been set forth in the foregoing description, together with details of the structure and function of the application, the disclosure is illustrative only, and changes may be made in detail, especially in matters of shape, size, and arrangement of parts within the principles of the application to the full extent indicated by the broad general meaning of the terms in which the appended claims are expressed.

What is claimed is:

1. A parallel testing system with shared golden calibration table, comprising:
   a storage unit for storing a shared golden calibration table;
   a plurality of testing platforms of a substantially similar type, each for testing a respective plurality of substantially similar devices under test (DUTs) according to said shared golden calibration table; and
   a server connected to the storage unit and said plurality of testing platforms, said server providing said shared golden calibration table to said plurality of the testing platforms, accumulating and cumulatively recording calibration data produced as the result of said testing of said respective pluralities of the DUTs performed at said pluralities of the testing platforms, applying a weighted arithmetic operation to said cumulatively recorded calibration data, and updating said shared golden calibration table in accordance with results of said weighted arithmetic operation based on the number of said testing platforms and the number of said DUTs tested thereat.

2. The parallel testing system as claimed in claim 1, wherein the storage unit is built in or externally connected to the server.

3. The parallel testing system as claimed in claim 2, wherein the storage unit is connected to the server in a wired or wireless manner.

4. The parallel testing system as claimed in claim 1, wherein the DUT is a wireless communication module, an image sensing module or a sound recognizing module.

5. The parallel testing system as claimed in claim 1, wherein the testing platforms respectively comprise:
   a testing instrument, for producing test signals for testing the DUT; and
   a controlling computer, for controlling the testing instrument to test the DUT and producing calibration data in accordance with a test result to be transmitted back to the server.

6. The parallel testing system as claimed in claim 5, wherein the controlling computer burns said shared golden calibration table into a respective one of said plurality of DUTs after said respective DUT passed the test.

7. A parallel testing method with shared golden calibration table, comprising the steps of:
   providing a plurality of devices under test (DUTs) to a plurality of testing platforms of substantially similar type;
   supplying a shared golden calibration table to said plurality of testing platforms;
   testing a respective plurality of the DUTs at each of said plurality of the testing platforms according to said shared golden calibration table and producing respective calibration data; and
   cumulatively recording the respective calibration data produced as the result of said testing of said respective pluralities of the DUTs performed at said plurality of the testing platforms, and executing a weighted arithmetic operation to said cumulatively recorded calibration data for updating the golden calibration table in accordance with results of said weighted arithmetic operation based on the number of said plurality of the testing platforms and numbers of said respective pluralities of the DUTs tested thereat,
   thereby accelerating a calibration convergence of said shared golden calibration table.

8. The method as claimed in claim 7, further comprising the steps of:
   after the step of cumulatively recording the calibration data, performing a step of judging whether the calibration data passes the test, and if the test result is negative, executing the weighted arithmetic operation.

9. The method as claimed in claim 8, further comprising the steps of:
   burning a current shared golden calibration table into a current DUT, and if the judging result is positive replacing the current DUT with the burned-in golden calibration table with a next DUT.

10. The method as claimed in claim 7, wherein the DUT is a wireless communication module, an image sensing module, or a sound recognizing module.

* * * * *